United States Patent [19]
Tomoyasu

[11] Patent Number: 5,067,798
[45] Date of Patent: Nov. 26, 1991

[54] LASER BEAM SCANNING SYSTEM

[75] Inventor: Masayuki Tomoyasu, Nirasaki, Japan

[73] Assignee: Tokyo Electron Limited, Tokyo, Japan

[21] Appl. No.: 316,140

[22] Filed: Feb. 27, 1989

[30] Foreign Application Priority Data

Feb. 29, 1988 [JP] Japan ................... 63-44612

[51] Int. Cl.$^5$ .................. G02F 1/11; G02F 1/33; G01R 1/00
[52] U.S. Cl. .................. 359/286; 324/158 R; 359/305; 359/245
[58] Field of Search .................. 350/355, 356, 358, 6.5; 324/158 R; 356/237, 400

[56] References Cited

U.S. PATENT DOCUMENTS

| | | | |
|---|---|---|---|
| 4,367,926 | 1/1983 | Hohki | 350/358 |
| 4,541,712 | 9/1985 | Whitney | 350/358 X |
| 4,733,176 | 3/1988 | Feuerbaum | 324/158 R |
| 4,906,922 | 3/1990 | Takahashi et al. | 324/158 R |

FOREIGN PATENT DOCUMENTS

| | | |
|---|---|---|
| 54-18759 | 2/1979 | Japan . |
| 62-47259 | 2/1987 | Japan . |
| 8600148 | 1/1986 | PCT Int'l Appl. ............ 350/358 |

Primary Examiner—Eugene R. LaRoche
Assistant Examiner—Michael B. Shingleton
Attorney, Agent, or Firm—Oblon, Spivak, McClelland, Maier & Neustadt

[57] ABSTRACT

A laser beam scanning system is used as a laser probing apparatus. The apparatus includes an acousto-optic modulator provided on an optical path for intensity-modulating a laser beam in accordance with an input signal, a beam intensity control device for measuring a beam intensity distribution of the laser beam incident on a wafer surface, for correcting the input signal to the modulator as a result of measurement, and for making uniform the laser beam illumination distribution over the wafer surface, and a device for measuring an electrical variation in that wafer pattern portion illuminated with the laser beam.

9 Claims, 4 Drawing Sheets

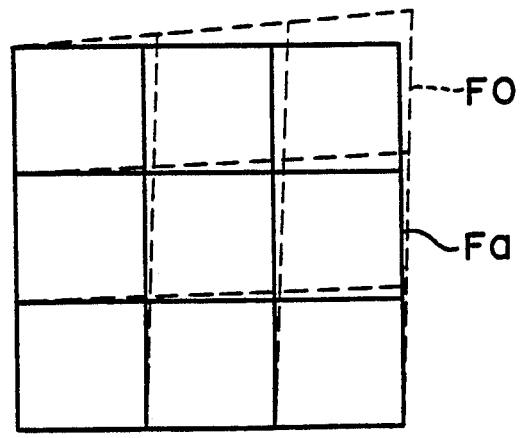
F I G. 5

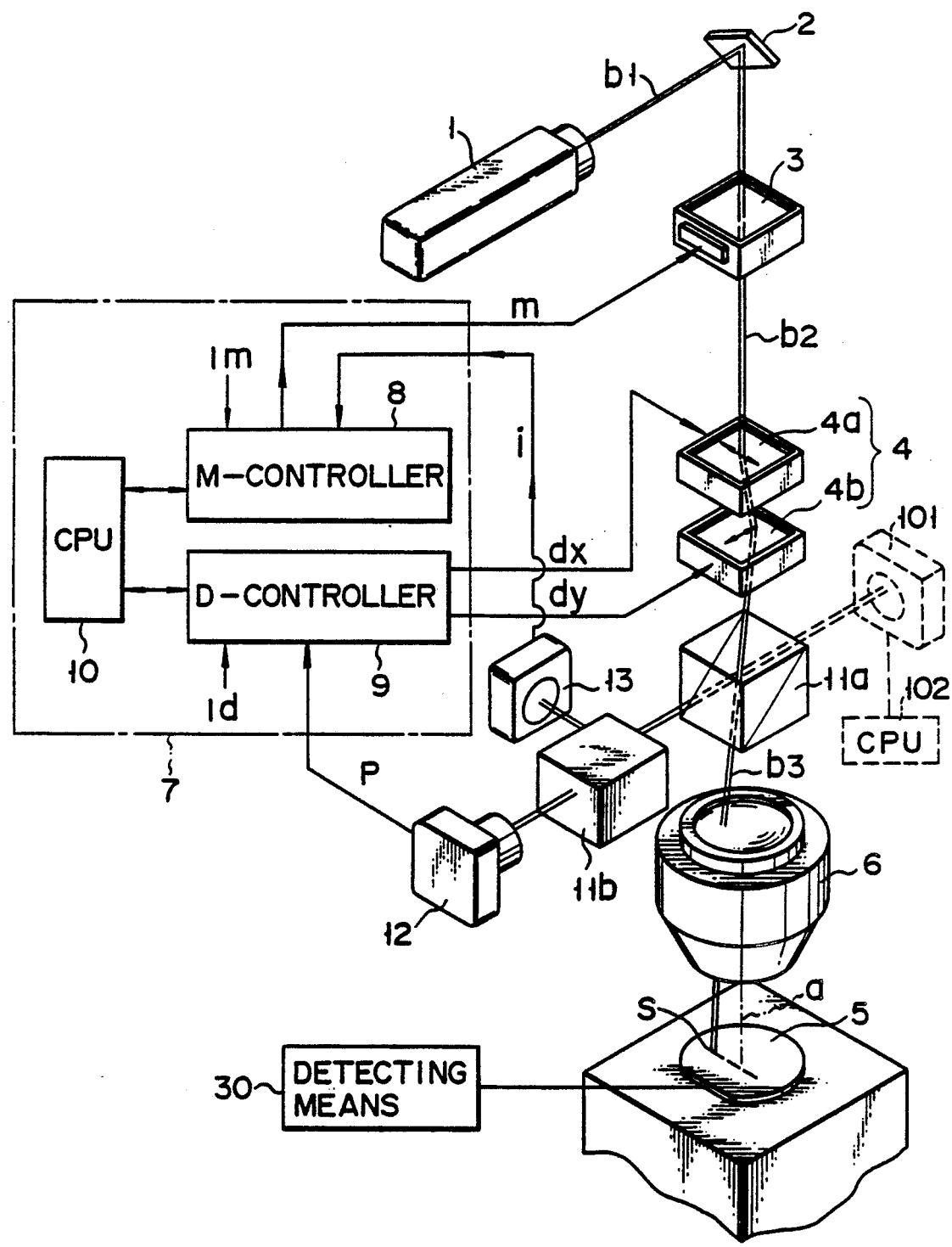
F I G. 3

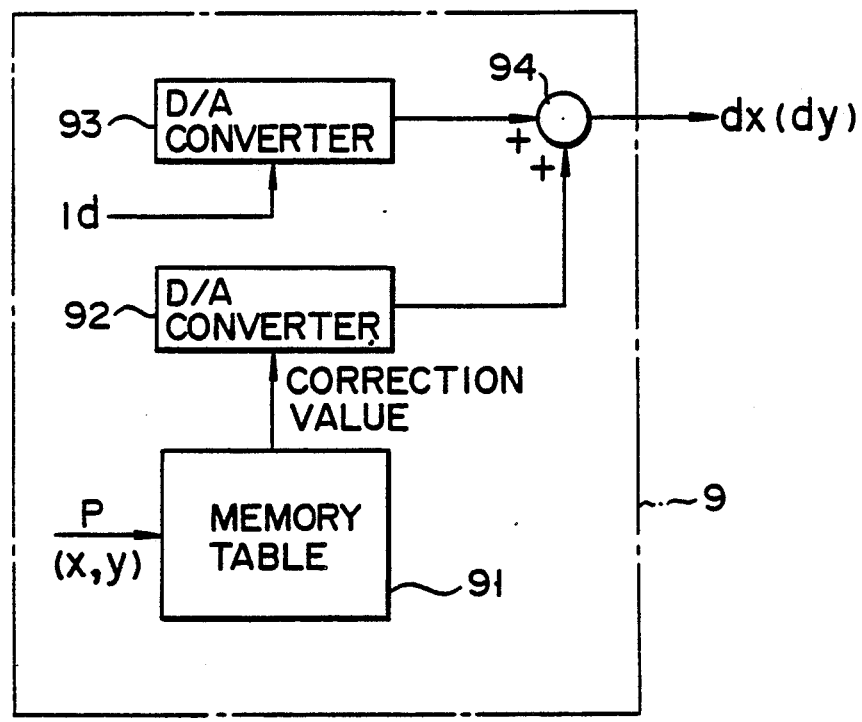
F I G. 4
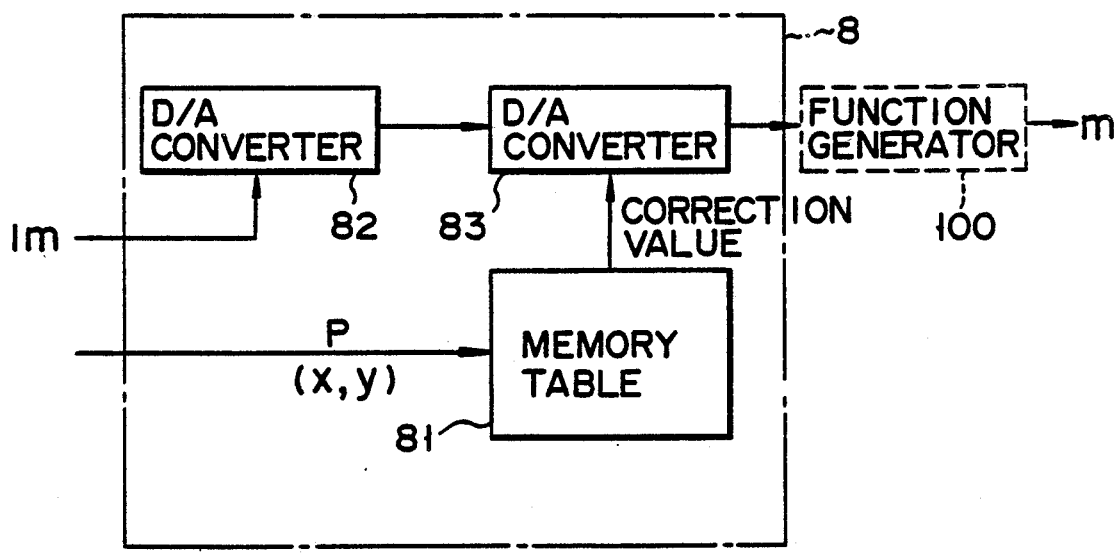
F I G. 6

LASER BEAM SCANNING SYSTEM

BACKGROUND OF THE INVENTION

1. Field of the Invention

The present invention relates to a laser beam scanning system equipped with a laser beam modulation (intensity) controller and laser beam deflector.

2. Description of the Related Art

In general, an optical device made of a substance medium, such as an optically anisotropic crystal, liquid crystal or conductive glass, is known as a laser beam modulation (intensity) controller and laser beam deflector, and hence as a control means for a laser beam scanning system, in terms of its structure, operation stability and controllability.

The laser beam intensity controller and laser beam deflector for the aforementioned substance medium unavoidably reveal a non-linear optical characteristic upon receipt of a control input. Upon deflecting a laser beam by, for example, a laser beam deflector, the laser beam deflector manifests the diffraction efficiency of non-linear character with respect to the deflection angle as shown in FIG. 1. In the graph shown in FIG. 1, the abscissa shows the deflection angle and the ordinate the diffraction efficiency. As seen from the graph, the diffraction efficiency varies depending upon the deflection angle and a laser beam emerging from the laser beam deflector varies in intensity depending upon the laser beam radiation position. It is, therefore, impossible to obtain an "as-controlled" beam intensity and either to illuminate a whole illumination surface with a laser beam of uniform intensity.

Furthermore a driver for the laser beam deflector has also a non-linear characteristic in general so that the laser beam is linearly not deflected for an instruction signal. A driver signal corresponding to a pattern as indicated by a in FIG. 2A, even if being applied to the laser beam deflector, is deformed into a pattern as indicated by b in FIG. 2B. It is, therefore, impossible to measure an accurate measurement even if such a laser beam scanning system is used for a measuring device such as a wafer probing apparatus using a laser beam. The measurement by using a probe is critical for a high density integrated circuit of for example 4M, 16M, or more bits. The laser probes has characteristics to measure such an integrated circuit, so that the deformation of a pattern is not avoidable for a laser probe.

SUMMARY OF THE INVENTION

It is accordingly the object of the present invention to provide a laser beam scanning system which may controllably orient a laser beam spot exactly onto a sample and onto a whole sample surface with an uniform beam intensity so that scanning is carried out.

A laser beam scanning system is provided according to the present invention which comprises:
  a laser beam source for emitting a laser beam;
  an optical means located along an optical path for a laser beam to be conducted to a surface of a sample;
  laser beam modulating means provided on the optical path to allow the laser beam to be intensity-modulated in accordance with an input signal;
  laser beam intensity control means for measuring an intensity distribution of the laser beam incident onto the sample surface, for making uniform a laser beam illumination distribution on the surface of the sample;
  laser beam deflecting means provided on the optical path to allow the laser beam to be deflected in accordance with an input signal;
  position detecting means for detecting a position of the laser beam incident on the sample surface and for delivering a beam illumination position information signal; and
  laser beam deflection control means for detecting by comparing a scanning deviation from a predetermined position information and the beam illumination position information and for correcting an input signal to the beam deflecting means so that a laser beam spot scans a predetermined position.

BRIEF DESCRIPTION OF THE DRAWINGS

FIG. 3 is a view diagrammatically showing a laser beam scanning system associated with an embodiment of the present invention;

FIG. 4 is a block diagram showing an arrangement of a beam deflection control circuit for position correction;

FIG. 5 shows a scanning pattern which is position-controlled by the system of FIG. 3;

FIG. 6 is a block diagram showing an arrangement of a beam modulation control circuit for beam intensity correction;

DETAILED DESCRIPTION OF THE PREFERRED EMBODIMENTS

Figure 1:
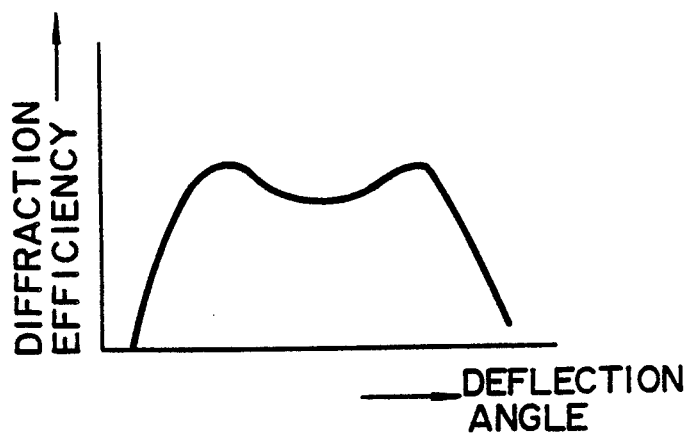
FIG. 1 is a curve diagram showing a relation of a diffraction efficiency to a deflection angle of a beam deflector.
Figure 2A:
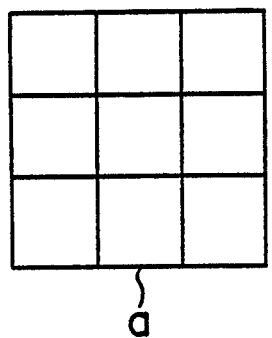
FIGS. 2A and 2B show a desired scanning pattern and an uncorrected scanning pattern.
Figure 2B:
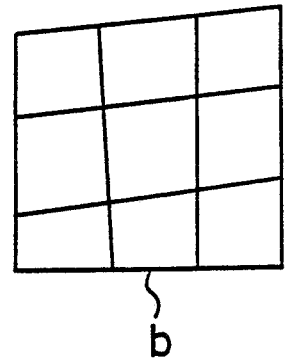

The embodiment of the present invention will be explained below as being applied to a laser probing device for a semiconductor wafer.

In FIG. 3, a laser beam b1 which is oscillated from an oscillator 1 is reflected by a mirror or a reflecting means 2 to allow it to be directed vertically down toward a sample, that is, a semiconductor wafer 5. The laser beam intensity controller or laser beam modulator 3, laser beam deflector 4, beam splitter 11a and object lens 6 are sequentially downwardly arranged, in that order, between the reflecting means 2 and the sample 5. Thus a laser beam b2 reflected by the reflecting means 2 is travelled past the laser beam modulator 3, laser beam deflector 4 and beam splitter 11a to the object lens 6 where it is converged onto the sample 5.

For example, an argon laser is employed as the laser beam oscillator 1 and 50x lens is used as the aforementioned lens in which case an area on the sample to be scanned with a laser beam is 256 μm square and a scan beam spot diameter and beam illumination position resolution are respectively 1 μm.

It is desired that an acousto-optic (A/O) modulator be used as the laser beam modulator 3 in terms of its stable operation and controllability. The modulator should not be restricted thereto. Taken for example, the acousto-optic modulator 3 comprises an acousto-optic medium, such as $TeO_2$, $PbMoO_4$ or fused quartz, a piezoelectric element mounted on one side of the medium and a second absorber attached to the other side of the medium. Upon the application of a high frequency signal to the piezoelectric element, the acousto-optic medium is oscillated so that ultrasound is propagated through the acousto-optic medium to provide a diffraction grating within the medium due to the generation of an elastic wave. When, therefore, a laser beam is incident on the medium, some of the beam is Bragg-diffracted, allowing an undiffracted transmission laser beam and diffracted laser beam to be alternately produced in accordance with ON or OFF of the ultrasound. If, for example, the transmission laser beam is employed as a scanning laser beam and the diffraction laser beam not as such, then the laser beam can be controlled in ON-OFF fashion, that is, the ON-OFF frequency of the laser beam can be varied by making ON-OFF operation of the frequency of the high-frequency signal to be supplied to the piezoelectric element. Upon varying the intensity of the ultrasound, an amount of laser beam to be diffracted varies, making it possible to intensity-modulate the beam. In the embodiment of the present invention a high-frequency signal of few hundreds of MHz is applied to the piezoelectric element so as to cause the laser beam to be controlled in ON-OFF fashion or to be intensity-modulated.

The laser beam deflector 4 imparts a given orientation to the laser beam b2 to form a beam spot S on the surface of the sample 5 at any desired spot. This embodiment includes an X-axis direction deflector 4a and Y-axis direction deflector 4b to deflect the laser beam in an orthogonal direction. Given an optical axis a on the sample surface as the origin of a coordinate, the position of a requisite beam spot S is measured as displacements from the optical center in the X- and Y-axes directions, and the X- and Y-axis displacements are imparted as an X-axis deflection control signal dx and Y-axis deflection control signal dy to the corresponding X- and Y-axes deflectors 4a and 4b. By so doing, the laser beam b2 passing through the laser beam modulator 3 is deflected at a desired emerging angle and incident onto the surface of the sample 5.

As the aforementioned deflector it is preferable to employ an acousto-optic (A/O) deflector the same as the laser beam modulator 3, but the present invention is not restricted particularly thereto.

The object lens 6 is used to, for example, properly converge a deflection laser beam b3 emerging from the laser beam deflector 4, to adjust the beam illumination area. Any lens known in the art is used as such.

In FIG. 3, an optical control system 7 comprises an optical modulation control circuit (M-controller) 8 for supplying a modulation control signal m to the laser beam modulator 3, a beam deflection control circuit (D-controller) 9 supplying two-direction deflection instruction signals dx and dy to the laser beam deflector 4 and a central processing unit (CPU) 10 connected to these control circuits to perform various operations.

In the aforementioned electro-optic system, as already set out above, the laser beam deflector 4 in particular has a diffraction efficiency of nonuniform character and hence the deflected laser beam b3 emerging from the laser beam deflector 4 contains an uneven quantity of light unavoidably in accordance with the deflection angle. If the acousto-optic deflection device is employed in particular, the frequency of the high-frequency oscillator reveals a linearity of 13% which is not good. The system of the present embodiment compensates a deformation component producing a pattern deformation on the sample surface and corrects the uneven quantity of light.

For this reason, the part of the deflection laser beam b3 emerging from the laser beam deflector 4 is separated, by the beam splitter 11a on the optical path, from the beam travelled toward the object lens 6, and directed to a position measuring device 12 which is located at a location equidistant from the sample 5. The position measuring device 12 is made up of an image sensing element, such as a CCD, and adapted to measure a beam illumination position on the sample 5. In order to implement a highly accurate position measurement, it is better to employ a high resolution CCD having a high-density pixel array. A vidicon using camera may be alternately used as the device 12.

A laser beam illumination position information signal p emerging from the position measuring device 12 is sent to a beam deflection control circuit 9 in the optical control system 7 and the central processing unit 10 finds the position of a laser beam spot S which is projected on the sample surface. By making a comparison between the position found and a desired correct position instruction value (standard value) Id which is initially determined, a correction value is produced which is given to the X-axis deflection control signal dx and Y-axis deflection control signal dy. An operation processing is performed over a whole area to be illuminated with a laser beam to find a correction coordinate value at each beam illumination spot. Each correction coordinate value is set to the beam deflection control circuit 9 whereby it is possible to correct a scanning deformation.

The beam deflection control circuit 9 for implementing the aforementioned position correction operation will be explained below with reference to FIG. 4.

The control circuit 9 is constructed by a memory (a correction value memory table) 91 for storing the correction coordinate value found by the aforementioned operation so that it corresponds to the X-Y coordinates system, a multiplying D/A converter 92 for performing a D/A conversion of a signal coming from the memory 91, a multiplying D/A converter 93 for performing a D/A conversion of the coordinates instruction signal, and an adder 94 for performing an addition of those signals which come from the D/A converters 92, 93. The beam deflection control circuit 9 sets a correction value on each coordinates spot, which is found at the central processing unit 10, to the memory table 91, reads out the correction value corresponding to the beam illumination position coordinates position from the memory table 91 at the time of a deflection operation, such as a scanning by a laser beam, adds it to the coordinates instruction value and supplies the added value, as the deflection control signals dx and dy, to the X- and Y-axes direction deflectors 4a and 4b, respectively.

When the deflection angle correction processing is performed in this way, a laser beam is defected based on control signals dx and dy with a positional deviation corrected by the X-axis direction deflector 4a and Y-axis direction deflector 4b, so that a beam illuminates the sample surface with high accuracy.

The aforementioned position operation processing is performed at high speed with an initially found correction value stored in the memory in the beam deflection control circuit 9, but if any high-speed deflection operation is not necessary, an associated circuit may be so designed as to perform the aforementioned correction operation, at the time of implementing a position measurement, while sequentially gaining access to the central processing unit 10 in real time.

If the position correction processing is thus performed, an uncorrected illumination pattern FO is normalized to a desired correction illumination pattern Fa as shown in FIG. 5 whereby it is possible to perform a beam illumination position control with high accuracy.

A beam intensity correction following the beam illumination position correction by the beam deflection control circuit 9 will be explained below in more detail.

Figure 7:
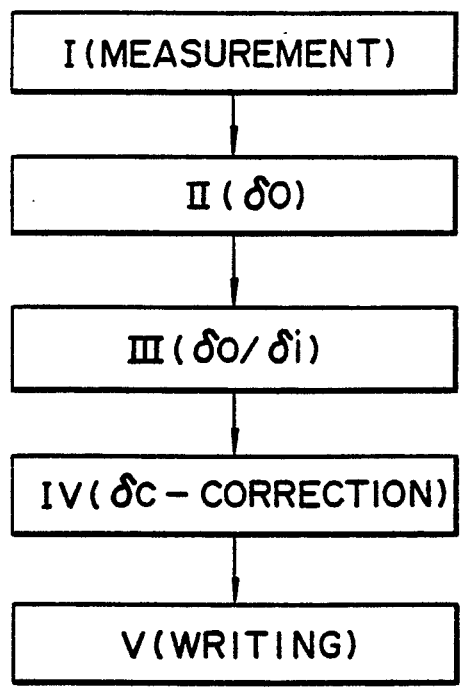
FIG. 7 is a flowchart for a beam intensity correction value setting processing.

A part of a laser beam b2 which is deflected by a laser beam deflector 4 is separated by the beam splitter 11b to a photoelectric transducer 13, such as a photodiode, where a corresponding quantity of light is detected. That light quantity signal i which is obtained by the photo-electric transducer 13 is sent to the beam modulation control circuit 8 where a beam intensity distribution is measured over the whole illumination area in which case the beam intensity deviation at each illumination spot is calculated in cooperation with the central processing unit 10 to find a correction value. The correction value is written into a memory (a correction value memory table) 81 in such a control circuit 8 as diagrammatically shown in FIG. 6. Such a write-in sequency is implemented in accordance with a flowchart as shown in FIG. 7.

Figure 8:
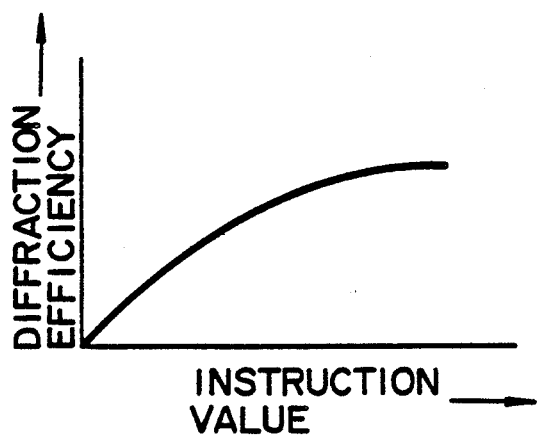
FIG. 8 is a curve diagram showing a relation between an instruction value to a beam modulator and a diffraction efficiency.

At step I, a beam intensity is measured, by the position measuring device 12, on the sample surface at each position coordinates point which is illuminated with a laser beam. At step II, a minimum value $\delta o$ is found for the laser beam intensity of each position coordinates point. At step III, the value $\delta o$ thus found is divided by a beam intensity measurement value $\delta$; at each measurement point. Since there is a relation between an initial beam intensity instruction value Im and a diffraction efficiency as shown in FIG. 8, the aforementioned correction value $\delta c$ is transformed, at step II, to an instruction correction value to be supplied to the beam modulator. In practice, the relation of FIG. 8 is initially expressed as a reverse function and computed numerically or set as a correction conversion table, and further a smooth conversion characteristic is found by, for example, implementing an interpolation among respective values (step V).

If, as indicated by the dotted line in FIG. 6, a circuit 100 for generating a function as a reverse function to the curve of FIG. 8 is added to a final stage for outputting a beam intensity instruction voltage, the aforementioned computation becomes unnecessary and it is possible to obtain a uniform intensity distribution even in the event of outputting a beam intensity other than the correction beam intensity. For the function generation circuit 100 use may be made of a digital circuit system for writing function values into a memory and generating data upon receipt of an address input, or an analog circuit, such as an AD 639 (Analog Devices Cop.), using a trigonometric function and operational amplifier.

The digital circuit can deal with a complex function, but, in general, is slow in speed compared with the analog circuit.

The aforementioned correction value is written into the beam modulation control circuit 8 and, if no adequate correction value is obtained by only one computation processing, the process as shown in FIG. 7 is repeated and, if the value obtained at each step is multiplied to a value obtained at a preceding step, it is possible to set a correction value whose correction error is suppressed to a maximum possible extent.

The correction value thus obtained is sequentially read out of the memory table 81 at the time of an actual beam illumination operation, such as the sample scanning and supplied to the beam modulator 3. The D/A conversion, upon the inputting of the intensity instruction value Im and upon the reading of the correction value out of the memory table 81, is achieved by the multiplying D/A converters 82 and 83, respectively.

By the aforementioned beam scanning system it is possible to position-control a beam illumination spot with high accuracy upon various optical scannings utilizing a laser beam and to achieve uniformity of a beam intensity distribution over a whole beam illumination area.

Figure 9:
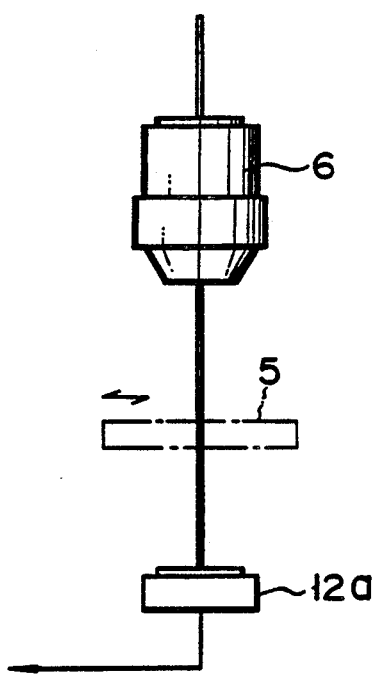
FIG. 9 shows part of a laser scanning system according to another embodiment of the present invention.

Although, in the aforementioned embodiment, the beam splitter has been explained as being provided to initially set the beam deflection correction value and beam intensity correction value, it is possible to obviate the necessity of providing the beam splitter by locating a deflector 12a comprising a position measuring device and photoelectric transducer or a combination unit of them, behind the sample 5 as shown in FIG. 9.

In FIG. 3, a measuring means 30 is provided which is constructed by, for example, a power supply and voltmeter. The measuring means 30 is electrically connected to a semiconductor wafer with an electrode pattern, such as an aluminum pattern formed thereon and adapted to measure an electrical variation at a semiconductor wafer spot which is illuminated with a laser beam.

If the scanning system shown in FIG. 3 is employed as a laser scanning type microscope, as the beam splitter 11a use may further be made of one for separating a portion of the deflection laser beam b3 reflected from the sample and, in this case, as indicated by the broken line in FIG. 3 it is only necessary to provide a photodiode 101 for receiving a separated beam and a CPU 102 for performing an image processing in accordance with a signal which comes from the photodiode 101.

As set forth above, the laser beam scanning system of the present invention has the following advantages.

Since, according to the present invention, use is made of the beam intensity control circuit as well as the beam deflection control circuit for allowing a correction value which corrects a deviation caused by the modulation and deflection of a laser beam to be given to an instruction value by which the laser beam to be directed to the sample at an illumination spot, a target to be scanned with a laser beam, is modulated and deflected, it is possible to control the beam illumination spot with high accuracy and hence to obtain an uniform beam intensity distribution over a whole area to be scanned with the laser beam. It is thus possible to achieve an enhanced accuracy, as well as an ultramicrofabrication, when a patterning step is effected upon a laser beam scanning on an LSI wafer, etc. with a laser beam. The system of the present invention can initially set correction values to the memory table for beam modulation and beam deflection control purposes and read out a correction coordinates value corresponding to a laser beam illumination position from the memory table upon the scanning of the sample surface with a laser beam. It is thus possible to apply the present invention also to a high-speed laser scanning.

Furthermore the present laser beam scanning system can assure a simplified structure and a ready control upon the scanning of the sample surface with a laser beam if the beam modulator and beam deflector are employed as an acousto-optic modulator and acousto-optic deflector, respectively. The present invention proves effective in practice if it is applied to a laser prober and laser scan microscope.

What is claimed is:

1. A laser beam scanning system comprising:
a laser beam source for emitting a laser beam;
an optical means located along an optical path for a laser beam to be conducted to a surface of a sample;
acousto-optic modulating means provided on the optical path to allow the laser beam to be continuously intensity-modulated in accordance with an input signal;
laser beam intensity control means for measuring an intensity distribution of the laser beam incident onto the sample surface, for making uniform a laser beam illumination distribution on the surface of the sample;
laser beam deflecting means provided on the optical path to allow the laser beam to be deflected in accordance with an input signal;
position detecting means for detecting a position of the laser beam incident on the sample surface and for delivering a beam illumination position information signal;
deviation detecting means coupled to said position detecting means be detecting any deviation in the scan of said laser beam from a predetermined position and the actual beam illumination position and
laser beam deflecting control means coupled to said laser beam deflecting means for correcting, in response to said deviation detecting means, the signal provided to the laser beam deflecting means, such that the projected spot of said laser beam scans at a predetermined position.

2. The laser beam scanning system according to claim 1, wherein said laser beam deflecting means has at least one acousto-optic modulator.

3. The laser beam scanning system according to claim 2, wherein said laser beam deflecting means comprises an X-axis acousto-optic deflector for deflecting said laser beam in an X-axis direction and Y-axis acousto-optic deflector for deflecting said laser beam in a Y-direction.

4. The laser beam scanning system according to claim 1, wherein said position detecting means comprises a beam splitter provided on said optical path to allow the laser beam to be split into a first beam directed toward said sample surface and a second beam directed in a direction different from that of the first beam, and a position measuring device for detecting and measuring a laser beam from said beam splitter and for detecting a beam illumination position.

5. The laser beam scanning system according to claim 1, wherein said laser beam deflection control means has means for correcting a scanning position over a whole beam illumination area, for performing an arithmetic operation on a correction coordinates value at each illumination spot, and for correcting a scanning position on the basis of the correction coordinates value.

6. The laser beam scanning system according to claim 5, wherein said beam deflecting means comprises a memory for storing a correction coordinates value, a converter for performing a digital/analog conversion of a signal coming from the memory, a converter for performing a digital/analog conversion of a coordinates instruction signal representing a predetermined correct position instruction value, and an adder for adding the signals from both the converters and for correcting an input signal to said beam deflecting means with a signal which is obtained as a result of addition.

7. A laser beam scanning system according to claim 1, wherein said acousto-optic modulating means has a circuit for measuring a beam intensity distribution over a whole beam illumination area and for performing an arithmetic operation on a beam intensity deviation at each illumination spot.

8. A laser beam scanning system comprising:
a laser beam source for emitting a laser beam;
optical means for conducting the laser beam to a surface of a semiconductor wafer along an optical path;
an acousto-optic modulator provided on an optical path for intensity-modulating the laser beam in accordance with an input signal;
a beam intensity control means for measuring a beam intensity distribution of the laser beam incident on the wafer surface, for correcting the input signal to said modulator as a result of measurement, and for making uniform the laser beam illumination distribution over the wafer surface; and
means for measuring said illumination of said wafer pattern by said laser beam and for outputting a signal indicative of any variation in the electrical properties in that portion of the wafer pattern that is illuminated with the laser beam.

9. A laser beam scanning system comprising:
a laser beam source for emitting a laser beam;
optical means located along an optical path for the laser beam to be conducted to a surface of a sample;
acousto-optic means located along the optical path, for deflecting the laser beam in accordance with a position detection signal;
acousto-optic modulating means located along the optical path to allow the laser beam to be continuously intensity-modulated in accordance with a frequency modulation of a high-frequency input signal;
means for measuring an intensity distribution of the intensity-modulated laser beam incident onto the surface of the sample;
means for correcting the high-frequency input signal with correction values to produce a corrected signal;
means for function-transforming the corrected signal to produce a function-transformed signal; and
means for applying the function-transformed signal to the acousto-optic modulating means so that the intensity distribution of the laser beam incident onto the surface of the sample becomes uniform.

* * * * *